(12) United States Patent
Birdsley et al.

(10) Patent No.: US 6,300,148 B1
(45) Date of Patent: *Oct. 9, 2001

(54) SEMICONDUCTOR STRUCTURE WITH A BACKSIDE PROTECTIVE LAYER AND BACKSIDE PROBES AND A METHOD FOR CONSTRUCTING THE STRUCTURE

(75) Inventors: Jeffrey David Birdsley; Victoria Jean Bruce, both of Austin, TX (US); Amy Elizabeth Lane, Highlands Ranch, CO (US)

(73) Assignee: Advanced Micro Devices, Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/166,266

(22) Filed: Oct. 5, 1998

(51) Int. Cl.[7] .............................. G01R 31/26; H01L 21/66; H01L 21/44; H01L 21/48; H01L 21/50
(52) U.S. Cl. ............................................... 438/15; 438/108
(58) Field of Search .............................. 257/48, 698, 621, 257/276; 438/11, 14–18, 667, 108, 734; 324/757

(56) References Cited

U.S. PATENT DOCUMENTS

| 5,414,284 | * | 5/1995 | Baxter et al. | 257/253 |
| 5,614,743 | * | 3/1997 | Mochizuki | 257/276 |
| 5,807,783 | * | 9/1998 | Gaul et al. | 438/406 |
| 5,952,247 | * | 9/1999 | Livengood | 438/734 |
| 5,972,725 | * | 10/1999 | Wollesen | 438/14 |

* cited by examiner

Primary Examiner—Tuan H. Nguyen
Assistant Examiner—Nema Berezny

(57) ABSTRACT

A semiconductor structure with a backside protective layer and backside probes and a method for constructing the structure. Consistent with one embodiment of the invention, the semiconductor structure comprises a substrate having a first surface, on which a circuit interconnect layer is formed, and a second surface. A protective layer is formed on the second surface of the substrate, wherein the protective layer is non-reactive with gas used to etch the substrate. An electrically conductive probe extends from the protective layer through the substrate to an active region which is disposed in the substrate.

24 Claims, 5 Drawing Sheets

SEMICONDUCTOR STRUCTURE WITH A BACKSIDE PROTECTIVE LAYER AND BACKSIDE PROBES AND A METHOD FOR CONSTRUCTING THE STRUCTURE

RELATED PATENT APPLICATIONS

This patent application is related to patent applications: "SEMICONDUCTOR STRUCTURE HAVING BACKSIDE PROBE POINTS FOR DIRECT SIGNAL ACCESS FROM ACTIVE AND WELL REGIONS" having docket number AMDA.205PA by Birdsley et al., having Ser. No. 09/166,651; and "ENDPOINT DETECTION FOR THINNING OF A FLIP CHIP BONDED INTEGRATED CIRCUIT" by Birdsley et al., having Ser. No. 09/166,833; all filed concurrent with the present application on, Oct. 5, 1998, assigned to the assignee of the present invention, and incorporated herein by reference.

FIELD OF THE INVENTION

The present invention is generally directed to semiconductor structures, and more particularly to a semiconductor structure having a backside protective layer and backside probes.

BACKGROUND OF THE INVENTION

During manufacture of an integrated circuit, electronic components are formed upon and within a front side surface of a semiconductor structure having opposed front side and backside surfaces. The components are inter-coupled with electrically conductive interconnect lines to form an electronic circuit. Signal lines that are to be connected to external devices are terminated at flat metal contact regions called input/output (I/O) pads. Following manufacture, the integrated circuit, or "chip," is typically secured within a protective semiconductor device package. Each I/O pad of the chip is then connected to one or more terminals of the device package. The terminals of a device package are typically arranged about the periphery of the package. The I/O pads of the chip are electrically connected to the terminals of the device package. Some types of device packages have terminals called "pins" for insertion into holes in a printed circuit board (PCB). Other types of device packages have terminals called "leads" for attachment to flat metal contact regions on an exposed surface of a PCB.

As integrated circuit fabrication technology improves, manufacturers are able to integrate more and more functions onto single silicon substrates. As the number of functions on a single chip increases, however, the number of signal lines that need to be coupled to external devices also increases. The corresponding numbers of required I/O pads and device package terminals increase as well, as do the complexities and costs of the device packages. Constraints of high-volume PCB assembly operations place lower limits on the physical dimensions of and distances between device package terminals. As a result, the areas of peripheral-terminal device packages having hundreds of terminals are largely proportional to the number of terminals. These larger packages with fine-pitch leads are subject to mechanical damage during handling or testing. Mishandling can result in a loss of lead co-planarity, adversely affecting PCB assembly yields. In addition, the lengths of signal lines from chip I/O pads to device package terminals increase with the number of terminals, and the high frequency electrical performance of larger peripheral-terminal device packages suffers as a result.

Grid array semiconductor device packages have terminals arranged in a two-dimensional array across an underside surface of the device package. As a result, the physical dimensions of grid array device packages having hundreds of terminals are much smaller than their peripheral-terminal counterparts. Such smaller packages are highly desirable in portable device applications such as laptop and palmtop computers and hand-held communications devices such as cellular telephones. In addition, the lengths of signal lines from chip I/O pads to device package terminals are shorter, thus the high-frequency electrical performances of grid array device packages are typically better than those of corresponding peripheral-terminal device packages. Grid array device packages also allow the continued use of existing PCB assembly equipment developed for peripheral-terminal devices.

An increasingly popular type of grid array device package is the ball grid array ("BGA") device package. FIG. 1 is a cross-sectional view of an example BGA device 10. The device 10 includes an integrated circuit 12 mounted upon a larger package substrate 14. Substrate 14 includes two sets of bonding pads: a first set of bonding pads 16 on an upper surface adjacent to integrated circuit 12 and a second set of bonding pads 18 arranged in a two-dimensional array across an underside surface. Integrated circuit 12 includes a semiconductor substrate 20 having multiple electronic components formed within a circuit layer 22 upon a front side surface of semiconductor substrate 20 during wafer fabrication. The electronic components are connected by electrically conductive interconnect lines to form an electronic circuit. Multiple I/O pads 24 are also formed within circuit layer 22. I/O pads 24 are typically coated with solder to form solder bumps 26.

The integrated circuit is attached to the package substrate using the controlled collapse chip connection method, which is also known as the C4® or flip-chip method. During the C4 mounting operation, solder bumps 26 are placed in physical contact with corresponding members of the first set of bonding pads 16. Solder bumps 26 are then heated long enough for the solder to reflow. When the solder cools, I/O pads 24 of integrated circuit 12 are electrically and mechanically coupled to the corresponding members of the first set of bonding pads 16 of the package substrate. After integrated circuit 12 is attached to package substrate 14, the region between integrated circuit 12 and package substrate 14 is filled with an under-fill material 28 to encapsulate the C4 connections and provide additional mechanical benefits.

Package substrate 14 includes one or more layers of signal lines that connect respective members of the first set of bonding pads 16 and the second set of bonding pads 18. Members of the second set of bonding pads 18 function as device package terminals and are coated with solder, forming solder balls 30 on the underside surface of package substrate 14. Solder balls 30 allow BGA device 10 to be surface mounted to an ordinary PCB. During PCB assembly, BGA device 10 is attached to the PCB by reflow of solder balls 30 just as the integrated circuit is attached to the package substrate.

The C4 mounting of integrated circuit 12 to package substrate 14 prevents physical access to circuit layer 22 for failure analysis and fault isolation. Thus, an alternative approach is to construct an electrically conductive probe that extends from the backside 40 of the substrate 20 to selected signal lines in the interconnect layer 22. The criteria for choosing the signal lines are based upon those signal lines that are expected to be at a certain signal level in accordance with a given test. As the density of components on the substrate 20 increases, it is becoming increasingly difficult to construct a probe that extends between the components. That is, there is an increasing risk that the probe may make contact with a component, for example, the drain region of a transistor, or otherwise interfere with the desired electrical characteristics of the component. Therefore, a semiconductor structure that addresses the aforementioned problems associated with flip-chip testing is desired.

SUMMARY OF THE INVENTION

In one embodiment, the invention is a semiconductor structure that comprises a substrate having a first surface, on which a circuit interconnect layer is formed, and a second surface. A protective layer is formed on the second surface of the substrate, the protective layer being non-reactive with gas used to etch the substrate. A first active region is disposed in the substrate, and first electrically conductive probe extends from the protective layer through the substrate to the first active region.

A semiconductor structure having a plurality of electrically conductive probes extending from the protective layer through the substrate to respective, selected ones of the active regions is provided in another embodiment. The structure also comprises a substrate having a first surface, on which a circuit interconnect layer is formed, and a second surface; a plurality of active regions disposed in the substrate; and a protective layer formed on the second surface of the substrate, wherein the protective layer is non-reactive with gas used to etch the substrate.

In another embodiment, a method is provided for making a semiconductor structure. The method comprises forming an integrated circuit on a first surface of a substrate, the integrated circuit having a plurality of active regions disposed in the substrate, and the substrate having a second surface. A protective layer is formed on the second surface of the substrate, wherein the protective layer is non-reactive with gas used to etch the substrate. An electrically conductive probe is constructed to extend from the protective layer through the substrate to a selected first one of the active regions.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood upon consideration of the following detailed description of various embodiments of the invention in connection with the accompanying drawings, in which.

Figure 1:
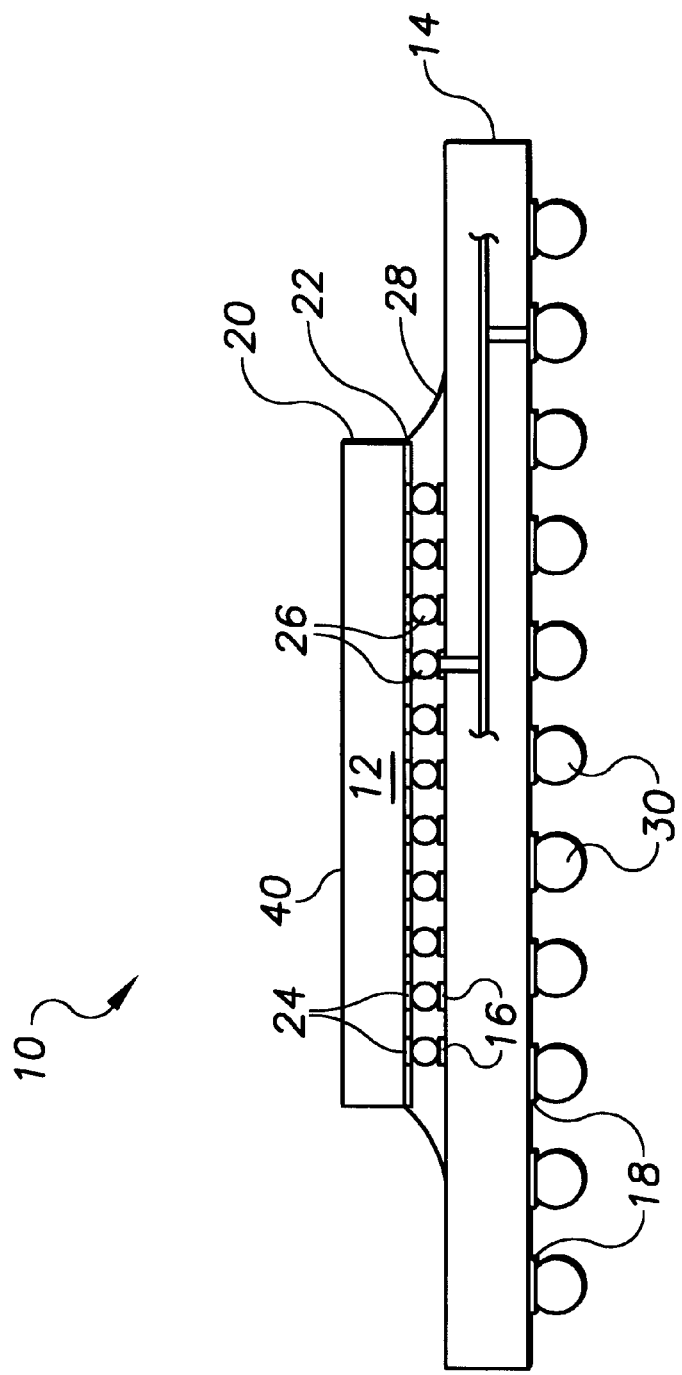
FIG. 1 is a cross-sectional view of an example ball grid array device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of flip-chip semiconductor structures. The invention has been found to be particularly advantageous in MOS devices, such as PMOS, NMOS, CMOS, or BiCMOS devices. While the present invention is not so limited, an appreciation of various aspects of the invention is best gained through a is discussion of various example semiconductor structures described below.

Figure 2:
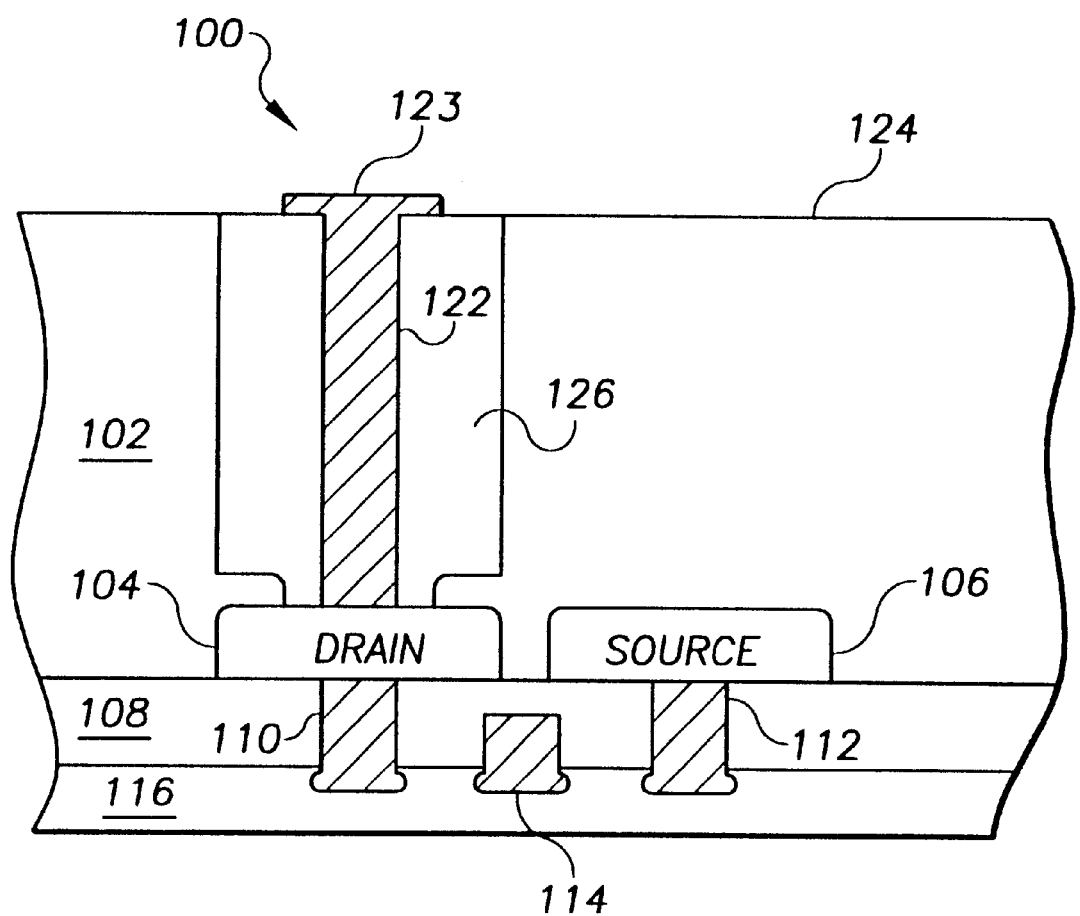
FIG. 2 is a cross-sectional view of a semiconductor structure having a probe that extends from the rear surface of the substrate to an active region.
Figure 3:
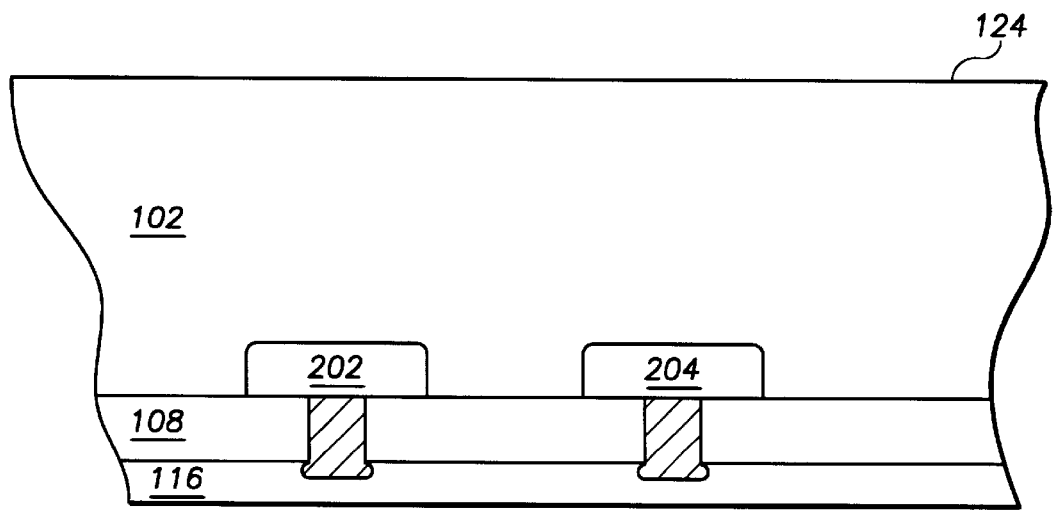
FIG. 3 is a cross-sectional view of an example semiconductor structure having two active regions to which probes are to be coupled.
Figure 4:
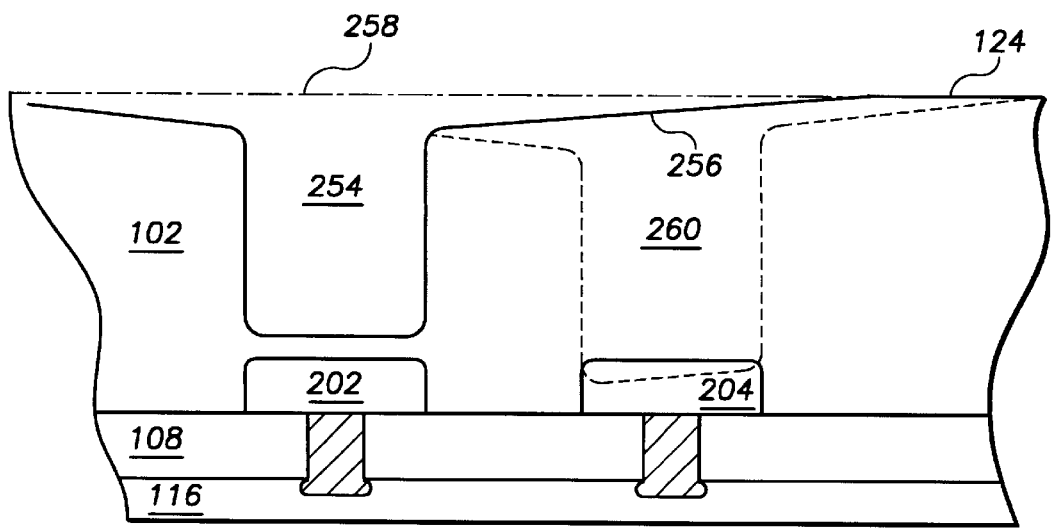
FIG. 4 is a cross-sectional view of a semiconductor structure in which a first cavity has been etched for forming a probe.

The invention permits etching a rear surface of a substrate to accommodate placement of probes in close proximity one to another. FIGS. 2–4 illustrate one example problem addressed by the present invention. FIG. 2 is a cross-sectional view of a semiconductor structure having a probe that extends from the rear surface of the substrate to an active region; FIG. 3 is a cross-sectional view of an example semiconductor structure having two active regions to which probes are to be coupled; and FIG. 4 is a cross-sectional view of the semiconductor structure of FIG. 3 in which a first cavity has been etched for forming a probe.

Referring first to FIG. 2, the structure 100 includes a substrate 102 in which are formed a drain region 104 and a source region 106. The substrate 102, along with the drain and source regions 104 and 106 can be constructed using conventional semiconductor processes, and p-type and n-type dopants are used in the various regions in accordance with implementation requirements. The drain and source regions 104 and 106 are example "active" regions of the semiconductor structure 100.

The structure 100 also includes an electrically insulative layer 108 through which electrical conductors 110 and 112 are respectively coupled to the drain and source regions 104 and 106. A gate electrode 114 is arranged to switch the transistor formed by the drain region 104, source region 106, and gate electrode 114.

The electrical conductors 110, 112, and 114 extend into the interconnect and passivation layer 116 where they are coupled to other signal lines (not shown) of the integrated circuit of which the structure 100 is a part.

The illustrated shapes of the elements 102–116 are intended to serve as examples. Those skilled in the art will recognize that semiconductor structures can assume many different shapes and profiles depending on the particular implementation requirements for the integrated circuit.

In accordance with the example embodiment of FIG. 2, an electrically conductive probe 122 extends from the rear surface 124 and is coupled to an example one of the active regions, namely, the drain region 104. Coupling the probe 122 to the drain region 104 eliminates the need to locate an interconnect signal line (not shown) in the interconnect layer 116 that is coupled to the drain region 104 and that at some location in the integrated circuit is accessible for constructing a probe.

The probe 122 includes a pad portion 123 that is large enough to make contact with conventional micro-probe test equipment. In addition, the probe 122 is electrically insulated from the substrate 102 with electrically insulative material 126.

To construct an example probe 122 where various active regions, 104 and 106 for example, have been formed in the substrate 102, a selected portion of the substrate at the desired location is etched away, leaving approximately 4–5 microns of substrate covering the region to be probed. A focused ion beam system can be used to create the final hole through the substrate to the region 104. The focused ion beam system can also be used to deposit the electrically insulative material 126.

It will be appreciated that a larger dimension probe cavity requires less precision than does a relatively smaller dimension probe cavity having a greater height. The methods used to insulate and fill such a cavity with conductive material generally depends upon the aspect ratio of the hole, that is the ratio of depth:width. In one example method, the entire hole is filled with electrically insulative material, and the insulative material is then etched back to a selected width to expose a portion of the desired region. Then, a metal such as copper or aluminum is deposited to make contact with the desired region. A pad 123 is then deposited on the surface of the substrate to provide for electrical contact with, for example, a micro-probe or electron beam system.

Referring now to FIG. 3, two example, adjacent active regions 202 and 204 in substrate 102 are to have probes coupled thereto from the rear surface 124 of the substrate. To construct such probes, cavities must first be etched in the substrate 102 to accommodate the probes. Using the above described methods, the cavities are etched one at a time. For example, first a cavity is etched for active region 202, and then a cavity is etched for active region 204.

FIG. 4 illustrates one example problem resulting from the above described method. If the cavity 254 for active region 202 is etched first, it can be seen that the rear surface 124 is splayed in an area surrounding the cavity 254, as illustrated by portion 256 of the rear surface 124. In an example method, a focused ion beam is used in combination with xenon di-flouride to remove the desired material. The xenon di-fluoride is highly reactive with the silicon substrate, thereby splaying the surface of the substrate. Line 258 illustrates the rear surface of the substrate prior to application of the focused ion beam and xenon di-flouride gas. In an alternate method, chlorine gas can be substituted for xenon di-flouride. However, chlorine is also highly reactive with a silicon substrate and also creates a splayed surface surrounding the cavity 254, but to a lesser degree.

The splayed portion 256 of the substrate 102 creates a problem in forming a cavity for the adjacent active region 204. The problem is that the splayed portion 256 of the substrate 102 overlaps the portion 260 of the substrate 102 to be etched. When the portion 260 is etched, the splayed portion causes the cavity 260 to be etched further than desired, i.e., into the active region 204. This can damage or destroy the device by etching away the active region and effectively removing part of the electrical circuit.

Another example problem created by the aforementioned etching techniques is found in locating areas of the substrate at which cavities are to be etched. Generally, a conventional infrared (IR) camera is used for such course navigation. However, if the surface 124 of the substrate 102 is not smooth, the view of structures below the surface is obscured. A rough surface results in diffraction of the IR light. Thus, the excess etching of the substrate resulting from the gas can cause severe problems in locating areas to be etched.

Figure 5:
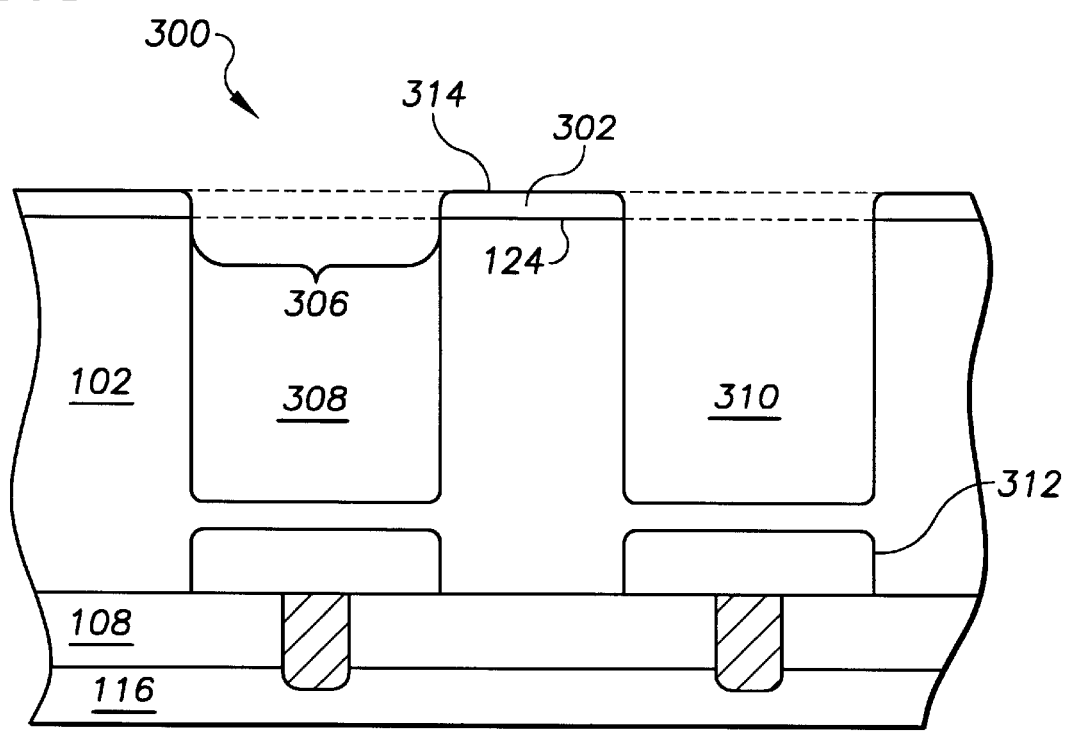
FIG. 5 is a cross-sectional view of a semiconductor structure in which a protective layer is formed on the rear surface of a substrate.

FIG. 5 is a cross-sectional view of a semiconductor structure 300 in which a protective layer 302 is formed on the rear surface 124 of substrate 102. The protective layer 302 is a material that is not reactive with the gas selected for use with the focused ion beam system. Example materials include silicon dioxide and silicon nitride. It is also desirable that layer 302 be electrically insulative. The thickness of the protective layer 302 can vary from hundreds of Angstroms to a few microns, depending upon the quality of the film and the particular gas chemistry used for etching.

The protective layer 302 is applied to the entire rear surface 124 of the substrate 102. When a cavity 308 is etched, the focused ion beam removes the protective layer from a selected area, 306 for example, and the gas reacts only with silicon in the selected area. Thus, the portion of the rear surface 124 surrounding the cavity 308 is not splayed as shown in FIG. 5.

The protective layer 302 permits a cavity 310 to be etched in relative proximity to cavity 308 while maintaining a desired depth from the rear surface 124 of the substrate 102, and hence a desired separation between the cavity 310 and the active region 312. The protective layer 302 also permits location of adjacent active regions with a conventional IR camera because a smooth surface 314 is maintained adjacent to the cavity 308.

Figure 6:
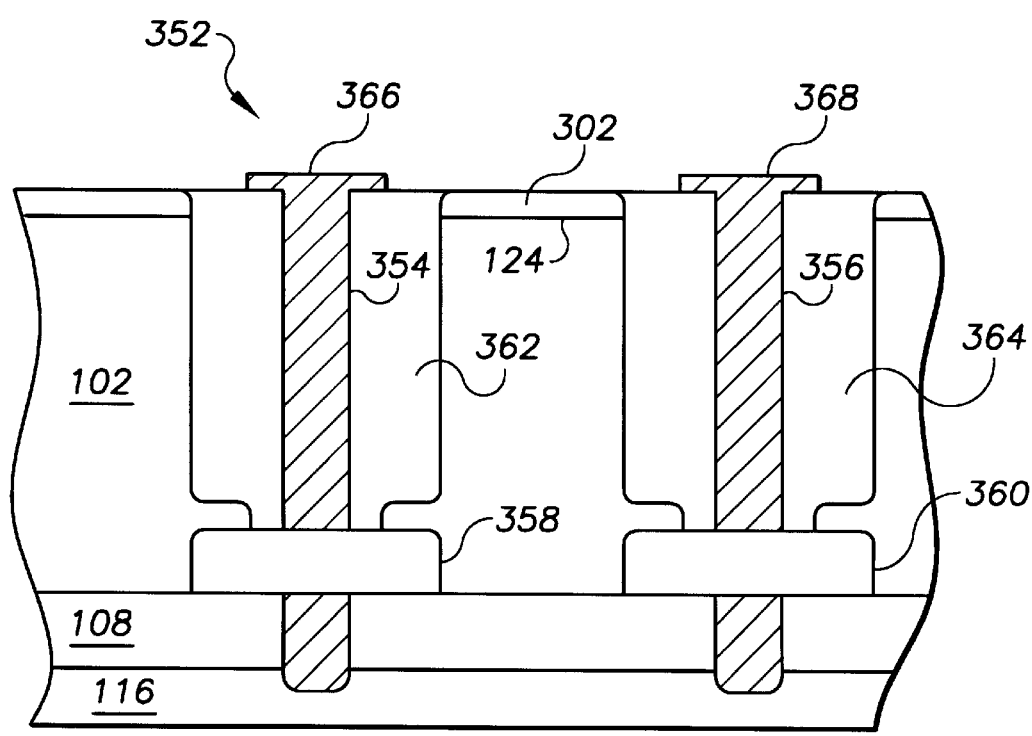
FIG. 6 is a cross-sectional view of a semiconductor structure in which probes have been formed and respectively coupled to active regions through the rear surface of a substrate having a protective layer, according to an example embodiment of the invention.

FIG. 6 is a cross-sectional view of a semiconductor structure 352 in which probes 354 and 356 have been formed and coupled to active regions 358 and 360 through the rear surface 124 of a substrate 102 having a protective layer 302, according to an example embodiment of the invention. The structure 352 also includes respective, electrically insulative regions 362 and 364 for the probes 354 and 356. Contact pads 366 and 368 are formed on the probes 362 and 364, respectively, for making contact with conventional microprobe test equipment to permit gathering of signals. It will be appreciated that additional probes can be constructed to respectively connect with additional active regions (not shown) of the semiconductor structure 352.

Figure 7:
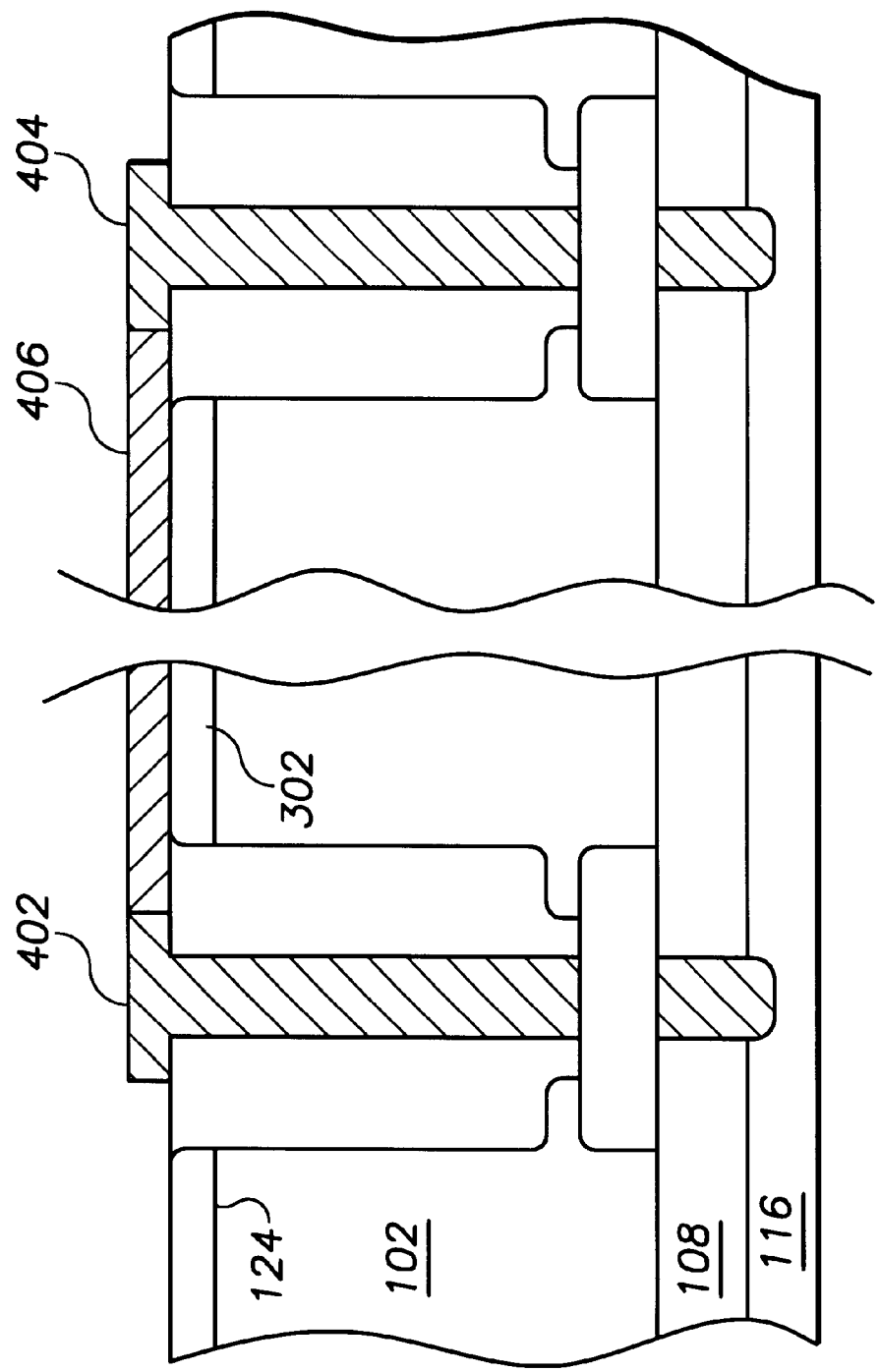
FIG. 7 illustrates an example embodiment in which two example probes are coupled one to the other via an electrically conductive metal trace that is deposited on the rear surface of the substrate over the protective layer.

FIG. 7 illustrates an example embodiment in which probes 402 and 404 are coupled one to the other via an electrically conductive metal trace 406 that is deposited on the rear surface of the substrate over the protective layer 302. The protective layer 302 having electrically insulative characteristics, insulates the electrically conductive substrate 102 from the metal trace 406. The protective layer 302 deposited over the entire rear surface of the substrate effectively provides the necessary insulation before recognition of where signals will be routed on the rear surface of the substrate.

As noted above, the present invention is applicable to a number of different semiconductor structures and arrangements. Accordingly, the present invention should not be considered limited to the particular examples described above, but rather should be understood to cover all aspects of the invention as fairly set out in the attached claims. Various modifications, equivalent structures, as well as numerous structures to which the present invention may be applicable will be readily apparent to those of skill in the art upon review of the present specification. The claims are intended to cover such modifications and devices.

What is claimed is:

1. A method for post-manufacturing analysis of a flip-chip integrated circuit die having circuitry in a circuit side opposite a back side, the method comprising:

forming a protective layer on a thinned surface of the back side of the die, the protective layer being adapted to prevent splay interference during subsequent etching;

removing a portion of the protective layer over target circuitry and exposing a portion of the thinned back side;

supplying an etch gas to the exposed portion and etching an opening in the back side extending from the exposed portion to the target circuitry;

depositing conductive material in the opening; and electrically coupling to the conductive material and analyzing the die therefrom.

2. The method of claim 1, further comprising thinning the back side of the flip chip die, prior to forming a protective layer.

3. The method of claim 1, further comprising using an IR camera and obtaining an image of circuitry in the die, subsequent to etching the opening, wherein the IR camera would not be able to image the circuitry, absent the protective layer.

4. The method of claim 1, after depositing the conductive material in the opening, further comprising:

removing a second portion of the protective layer over second target circuitry and exposing a second portion of the thinned back side;

supplying an etch gas to the surface and etching a second opening in the back side extending from the second exposed portion to the second target circuitry;

depositing a conductive material in the second opening; and electrically coupling to the conductive material and analyzing the die therefrom.

5. The method of claim 4, wherein the exposed portions are selected to be sufficiently close such that, absent the protective layer, splay interference from the first etching would interfere with the etching of the second opening.

6. The method of claim 5, wherein the etching is performed using a similar process for each opening, and wherein the etching of the second opening would etch into the second target circuitry, absent the protective layer, due to the splay interference removing a portion of the thinned backside prior to etching the second opening.

7. The method of claim 4, further comprising depositing a conductive material over the thinned back side and electrically coupling the conductive material in each of the openings.

8. The method of claim 1, wherein the etching includes using a focused ion beam.

9. The method of claim 1, wherein at least one of removing a portion of the protective layer and depositing conductive material includes using a focused ion beam.

10. The method of claim 1, wherein forming a protective layer includes forming at least one of: an electrically insulative layer, a layer comprising silicon dioxide and a layer comprising silicon nitride.

11. The method of claim 1, further comprising forming an electrically insulative material in the opening, the electrically insulative material being adapted to insulate the conductive material from the back side.

12. The method of claim 11, wherein depositing an electrically insulative material in the opening comprises:

prior to depositing conductive material in the opening, depositing electrically insulative material in the opening;

etching an opening in the electrically insulative material extending to the target circuitry; and wherein depositing conductive material in the opening includes depositing conductive material in the opening etched in the insulative material.

13. The method of claim 4, further comprising forming an electrically insulative material in the opening, the electrically insulative material being adapted to insulate the conductive material from the back side.

14. The method of claim 1, wherein electrically coupling to the conductive material includes at least one of: performing failure analysis, performing fault isolation and detecting a signal.

15. The method of claim 1, wherein removing a portion of the protective layer over target circuitry includes removing a portion of the protective layer over at least one of: an active region, a source region and a drain region.

16. A method for post-manufacturing analysis of a flip-chip integrated circuit die having circuitry in a circuit side opposite a back side, the method comprising:

forming a protective layer on a thinned surface of the back side of the die, the protective layer being adapted to prevent splay interference during subsequent etching;

removing a first portion of the protective layer over first target circuitry with a focused ion beam and exposing a first portion of the thinned back side;

supplying an etch gas to the first exposed portion and etching a first opening in the back side extending from the first exposed portion to a first active region;

depositing conductive material in the first opening;

using an IR camera and obtaining an image of circuitry in the die, subsequent to etching the first opening, wherein the IR camera would not be able to image the circuitry, absent the protective layer;

using the image of the circuitry and identifying second target circuitry;

removing a second portion of the protective layer over the second target circuitry with a focused ion beam and exposing a second portion of the thinned back side;

supplying an etch gas to the surface and etching a second opening in the back side extending from the second exposed portion to the second target circuitry;

depositing conductive material in the second opening; and electrically coupling to conductive material in at least one of the openings and analyzing the die therefrom.

17. A system for post-manufacturing analysis of a flip-chip integrated circuit die having circuitry in a circuit side opposite a back side, the system comprising:

means for forming a protective layer on a thinned surface of the back side of the die, the protective layer being adapted to prevent splay interference during subsequent etching;

means for removing a portion of the protective layer over target circuitry and exposing a portion of the thinned back side;

means for supplying an etch gas to the exposed portion and etching an opening in the back side extending from the exposed portion to the target circuitry;

means for depositing conductive material in the opening; and means for electrically coupling to the conductive material and analyzing the die.

18. A system for post-manufacturing analysis of a flip-chip integrated circuit die having circuitry in a circuit side opposite a back side, the system comprising:

a formation arrangement adapted to form a protective layer on a thinned surface of the back side of the die, the protective layer being adapted to prevent splay interference during subsequent etching;

a removal arrangement adapted to remove a portion of the protective layer over target circuitry and expose a portion of the thinned back side;

a gas supply adapted to supply an etch gas to the exposed portion and etch an opening in the back side extending from the exposed portion to the target circuitry;

a deposition arrangement adapted to deposit conductive material in the opening; and a testing arrangement adapted to electrically couple to the conductive material and analyze the die.

19. The system of claim 18, wherein the formation arrangement is adapted to form a protective layer that sufficiently preserves the thinned surface to facilitate IR imaging of the circuitry through the back side.

20. The system of claim 18, further comprising a substrate removal arrangement adapted to remove substrate from the back side and form the thinned surface.

21. The system of claim 18, wherein the formation arrangement is adapted to form a protective layer including at least one of: an electrically insulative material, silicon dioxide, silicon nitride, and a material that is non-reactive with the etch gas.

22. The system of claim 18, further comprising a formation arrangement adapted to form an electrical conductor coupled to the first probe and disposed on the protective layer.

23. The system of claim 18, wherein the removal arrangement is adapted to remove two portions of the protective layer and expose two portions of the thinned backside, and the gas supply is further adapted to etch an opening in each exposed portion, wherein the two exposed portions are selected to be sufficiently close such that, absent the protective layer splay interference from the first etching would interfere with the etching of the second opening.

24. The system of claim 18, wherein the deposition arrangement is further adapted to form an insulative layer in the opening, the insulative layer being adapted to electrically insulate the conductive material from the back side in which the opening is formed.

\* \* \* \* \*

UNITED STATES PATENT AND TRADEMARK OFFICE
CERTIFICATE OF CORRECTION

PATENT NO. : 6,300,148 B1  
DATED : October 9, 2001  
INVENTOR(S) : Birdsley et al.

Page 1 of 1

It is certified that error appears in the above-identified patent and that said Letters Patent is hereby corrected as shown below:

<u>Column 1,</u>  
Line 12, "09/166,651" should read -- 09/166,656 --.

<u>Column 4,</u>  
Line 26, after "through a", please delete "is".

Signed and Sealed this

Sixteenth Day of April, 2002

Attest:

JAMES E. ROGAN  
*Attesting Officer*   *Director of the United States Patent and Trademark Office*